(12) United States Patent
Choi et al.

(10) Patent No.: US 7,499,306 B2
(45) Date of Patent: Mar. 3, 2009

(54) PHASE-CHANGE MEMORY DEVICE AND METHOD THAT MAINTAINS THE RESISTANCE OF A PHASE-CHANGE MATERIAL IN A SET STATE WITHIN A CONSTANT RESISTANCE RANGE

(75) Inventors: Byung-gil Choi, Yongin-si (KR); Choong-keun Kwak, Suwon-si (KR); Sang-beom Kang, Hwaseong-si (KR); Joon-yong Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/772,569

(22) Filed: Jul. 2, 2007

(65) Prior Publication Data

US 2008/0013362 A1 Jan. 17, 2008

Related U.S. Application Data

(63) Continuation-in-part of application No. 10/937,943, filed on Sep. 11, 2004, now Pat. No. 7,242,605.

(51) Int. Cl.
*G11C 11/00* (2006.01)

(52) U.S. Cl. .............. 365/148; 365/189.16; 365/230.06

(58) Field of Classification Search ................. 365/148, 365/189.16, 230.06
See application file for complete search history.

(56) References Cited

U.S. PATENT DOCUMENTS 6,928,022 B2 * 8/2005 Cho et al. ................. 365/225.7
7,110,286 B2 * 9/2006 Choi et al. .................. 365/163

* cited by examiner

*Primary Examiner*—Hoai V Ho
(74) *Attorney, Agent, or Firm*—F. Chau & Assoc., LLC (57) ABSTRACT

Provided are a phase-change memory device and method that maintains a resistance of a phase-change material in a set state within a constant resistance range. In the method, data is provided to a first phase-change memory cell and then it is first determined whether data stored in the first phase-change memory cell and the data provided to the first phase-change memory cell are identical. If the data stored in the first phase-change memory cell and the data provided to the first phase-change memory cell are not identical, a complementary write current is provided to the first phase-change memory cell and it is second determined whether the data stored in the first phase-change memory cell and the data provided to the first phase-change memory cell are identical. If the data stored in the first phase-change memory cell and the data provided to the first phase-change memory cell are identical, data is provided to a second phase-change memory cell.

3 Claims, 6 Drawing Sheets

PHASE-CHANGE MEMORY DEVICE AND METHOD THAT MAINTAINS THE RESISTANCE OF A PHASE-CHANGE MATERIAL IN A SET STATE WITHIN A CONSTANT RESISTANCE RANGE

CROSS-REFERENCE TO RELATED APPLICATION

This application is a Continuation-In-Part of U.S. patent application Ser. No. 10/937,943 filed Sep. 11, 2004 now issued as U.S. Pat. No. 7,242,605.

BACKGROUND OF THE INVENTION

1. Technical Field

The present disclosure relates to a phase-change memory device, and more particularly, to a phase-change memory device and method that maintains the resistance of a phase-change material used in the memory device within a constant resistance range in a set state.

2. Discussion of Related Art

Resistive memories are non-volatile memory devices that store data using a phase-change material, e.g., Ge—Sb—Te (GST), whose resistance changes upon a phase transition due to a change in temperature.

The phase-change material of a resistive memory cell goes into a crystalline state or an amorphous state depending on the temperature and duration of heating applied to the phase-change material, thereby storing data. In general, a high temperature above 900° C. is required for a phase transition of the phase-change material to occur. Such high temperatures are obtained by Joule heating caused by current flowing through the resistive memory cell.

A write operation for the phase-change material will now be explained. First, the phase-change material is heated above its melting temperature by a current flowing through the phase-change material, and then it is rapidly cooled. Next, the phase-change material goes into the amorphous state and stores data, e.g., "1". This state is referred to as a reset state. The phase-change material is then heated above its crystallization temperature for a predetermined period of time, and cooled. Next, the phase-change material goes into the crystalline form and stores data, e.g., "0". This state is referred to as a set state.

A read operation for the phase-change material will now be explained. After a bit line and a word line are selected to select a memory cell using the phase-change material, an external current is provided to the selected memory cell. It is then determined whether data stored in the selected memory cell is, e.g., "1" or "0", based on a voltage change caused by a resistance of the phase-change material of the selected memory cell.

The operation of writing data to a phase-change memory cell (e.g., a memory cell using a phase-change material) is initiated by Joule heating, which increases or decreases in proportion to a width of a bottom contact that contacts the phase-change material. Due to various reasons, however, such as defects arising during manufacturing, the widths of the bottom contacts that contact the phase-change materials may be non-uniform depending on the positions of the memory cells of a phase-change memory cell array. In addition, in memory cells having non-uniform bottom contact widths, phase-change materials do not completely enter the reset state. Thus, during the read operation, the resistances of the phase-change materials in the reset state may be non-uniform, causing failures during the read operation.

Figure 1:
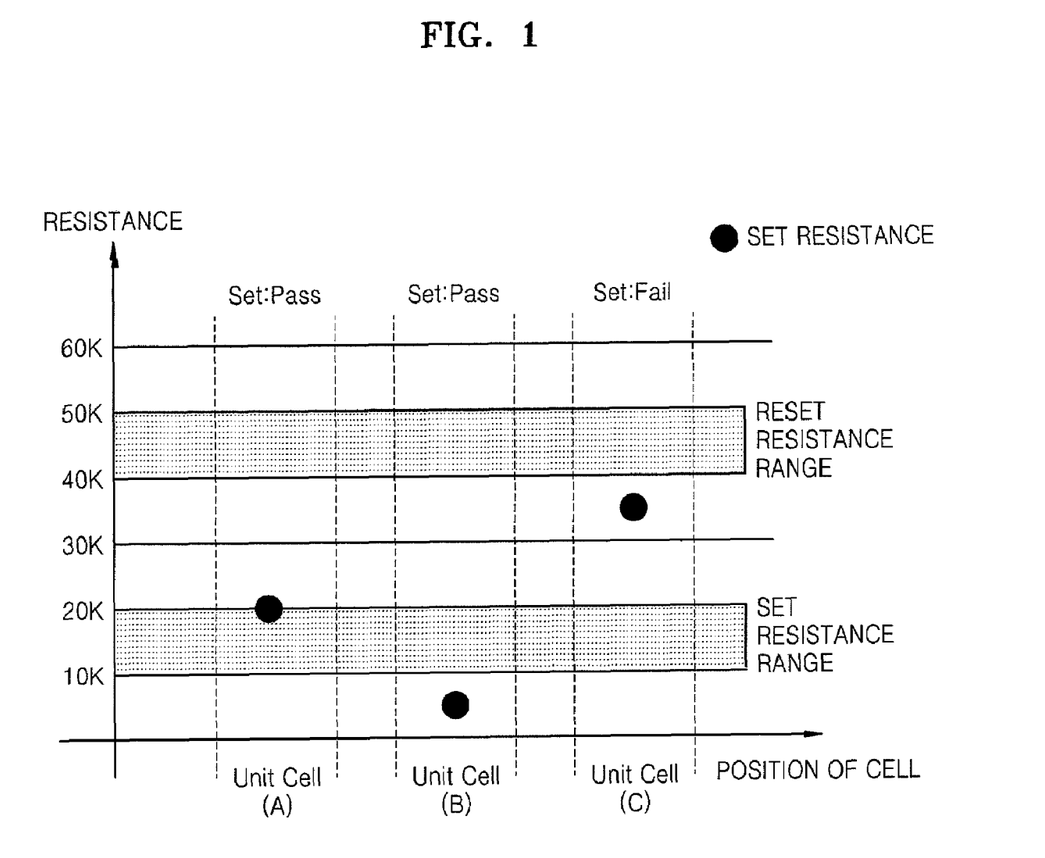
FIG. 1 is a graph illustrating a resistance range with respect to positions of the unit cells in a set state.

FIG. 1 is a graph illustrating a resistance range with respect to the position of a phase-change memory cell in regard to a set state. In FIG. 1, it is assumed that a set resistance range of a phase-change material extends from 10 to 20 KΩ and a reset resistance range of the phase-change material extends from 40 to 50 KΩ. As can be seen from FIG. 1, when the same set current is provided to, for example, the unit cells A, B and C of FIG. 1, set resistances vary among the unit cells A, B, and C.

The set resistance of the unit cell A lie in an average resistance range of 10 KΩ to 20 KΩ in the set state. The set resistance of the unit cell B lies below the average set resistance range of 10 KΩ to 20 KΩ. The set resistance of the unit cell C lies above the average resistance range 10 KΩ to 20 KΩ in the set state. Thus, during an operation of reading data from the unit cells A and C, the states (e.g., the set states) of the unit cells A and C can be sensed normally. However during an operation of reading data from the unit cell B, the normal sensing operation cannot be performed and sensing failures may occur during the read operation.

As such, due to manufacturing defects, the widths of bottom contacts that contact phase-change materials may vary among different unit cells in a phase-change memory cell array. Thus, the phase-change materials of the unit cells in a set state have different resistances and failures may occur during read operations.

SUMMARY OF THE INVENTION

According to an exemplary embodiment of the present invention, there is provided a method of maintaining a resistance of a phase-change material in a set state within a constant resistance range, the method comprises: providing data to a first phase-change memory cell; first determining whether data stored in the first phase-change memory cell and the data provided to the first phase-change memory cell are identical; if the data stored in the first phase-change memory cell and the data provided to the first phase-change memory cell are not identical, providing a complementary write current to the first phase-change memory cell and second determining whether the data stored in the first phase-change memory cell and the data provided to the first phase-change memory cell are identical; and providing data to a second phase-change memory cell if the data stored in the first phase-change memory cell and the data provided to the first phase-change memory cell are identical. The data provided to the first phase-change memory cell is set data.

The steps of first and second determining whether the data stored in the first phase-change memory cell and the data provided to the first phase-change memory cell are identical each comprise: latching the data provided to the first phase-change memory cell; sensing the data stored in the first phase-change memory cell; and comparing the sensed data with the latched data. The complementary write current is increased when it is provided to the first phase-change memory cell.

According to an exemplary embodiment of the present invention, there is provided a phase-change memory device comprising a write driver, a data sensing unit, a comparing unit, and a pulse control unit. The write driver receives data, provides the data to a phase-change memory cell, and provides a complementary write current to the phase-change memory cell in response to first through $n^{th}$ current control signals.

The data sensing unit senses data stored in the phase-change memory cell and outputs a logic value of the data stored in the phase-change memory cell as a cell data signal. The comparing unit determines whether the data provided to the phase-change memory cell and the data stored in the phase-change memory cell are identical in response to the cell data signal and outputs a comparison result as a detection signal.

The pulse control unit generates the first through $n^{th}$ current control signals in response to the detection signal and a pulse signal. The phase-change memory device may further comprise a latch unit which latches the data provided to the phase-change memory cell.

The pulse control unit outputs the first through $n^{th}$ current control signals in response to the pulse signal if a logic level of the detection signal is at a first level, and does not output the first through $n^{th}$ current control signals if the logic level of the detection signal is at a second level.

The complementary write current is increased in response to the first through $n^{th}$ current control signals. The detection signal is generated at the first level if the data provided to the phase-change memory cell and the data stored in the phase-change memory cell are not identical, and the detection signal is generated at the second level if the data provided to the phase-change memory cell and the data stored in the phase-change memory cell are identical.

The data provided to the phase-change memory cell is set data. The write driver stores the data in the phase-change memory cell in response to the set data and a set pulse, receives the first through $n^{th}$ current control signals that are at the first level, increases an amount of the complementary write current, and provides the increased complementary write current to the phase-change memory cell.

The first through $n^{th}$ current control signals are generated at the first level if the data provided to the phase-change memory cell and the data stored in the phase-change memory cell are not identical, and the first through $n^{th}$ current control signals are generated at the second level if the data provided to the phase-change memory cell and the data stored in the phase-change memory cell are identical.

BRIEF DESCRIPTION OF THE DRAWINGS

The above aspects of the present invention will become more apparent by describing in detail exemplary embodiments thereof with reference to the attached drawings, in which.

DETAILED DESCRIPTION OF EXEMPLARY EMBODIMENTS

Figure 2:
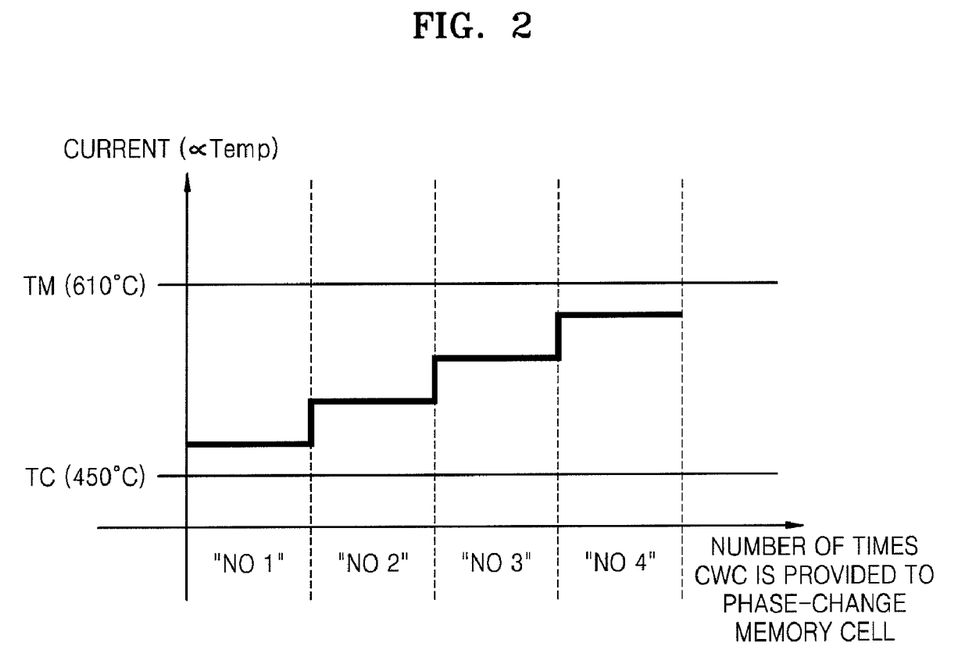
FIG. 2 is a graph illustrating a complementary write current (CWC) that is provided to a phase-change memory cell.

FIG. 2 is a graph illustrating a complementary write current that is provided to a phase-change memory cell.

Figure 3:
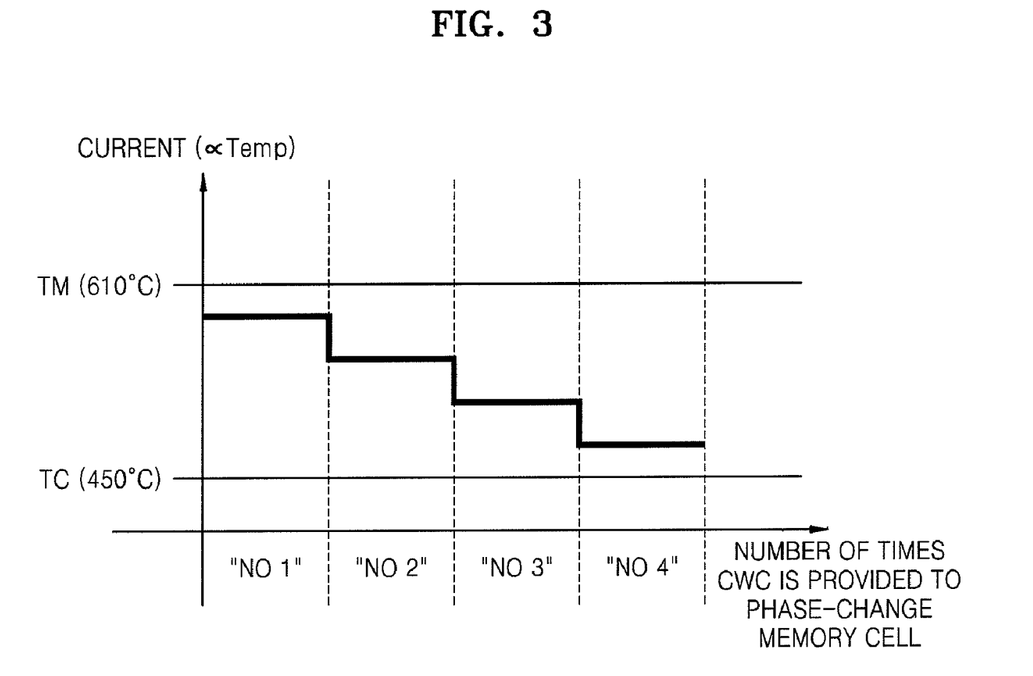
FIG. 3 is a graph illustrating a complementary write current (CWC) for the set state.

Referring to FIG. 3, as the number of times the complementary write current CWC is provided to a phase-change memory cell increases, the complementary write current CWC also increases. As shown in FIG. 2, the complementary write current is between TC and TM.

Referring to FIG. 3, as the set current drops and the number of times the complementary write current CWC is provided to a phase-change memory increases, the complementary write current CWC decreases.

Figure 4:
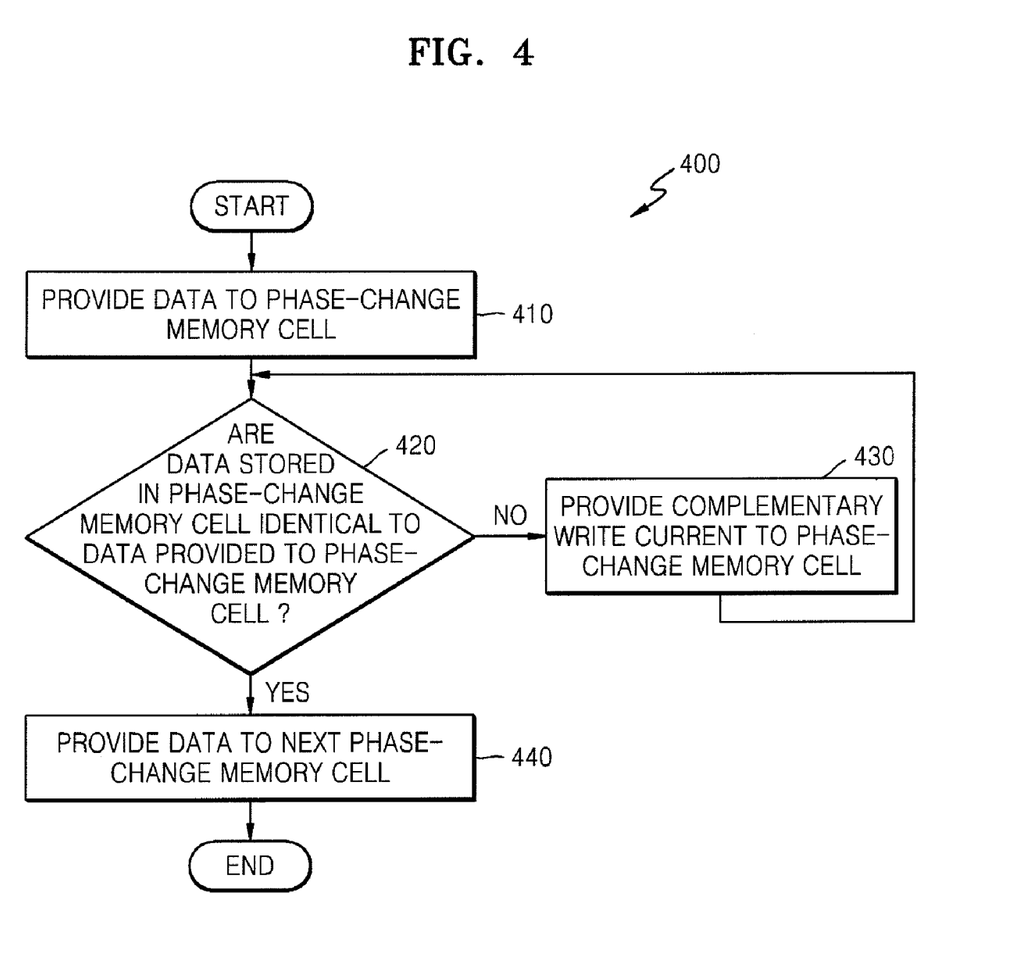
FIG. 4 is a flowchart illustrating a method of maintaining a resistance of a phase-change material in a set state within a constant resistance range according to an exemplary embodiment of the present invention.

FIG. 4 is a flowchart illustrating a method 400 of maintaining a resistance of a phase-change material in a set state within a constant resistance range, according to an exemplary embodiment of the present invention.

According to the method 400, set data for causing a phase-change material of a phase-change memory cell to enter a set state is provided to the phase-change memory cell, and then it is determined whether the phase-change memory cell has entered the set state. During this time, current is provided to the phase-change material until the phase-change material has gone into the set state. If it is determined that the phase-change material has gone into the set state, set data is provided to another phase-change memory cell.

As shown in FIG. 4, in step 410, data is provided to a phase-change memory cell. Here, the data is set data. Step 410 is performed to enable the phase-change memory cell to stabilize in the set state irrespective of the width of a bottom contact that contacts the phase-change material.

In step 420, it is determined whether data stored in the phase-change memory cell is identical to the data provided to the phase-change memory cell. Step 420 includes latching and storing the data provided to the phase-change memory cell, sensing the data stored in the phase-change memory cell, and comparing the sensed data with the latched data.

Because the data provided to the phase-change memory cell is set data, it has, for example, a logic value "0". If the phase-change material of the phase-change memory cell has transited to the reset state in response to the reset data, the sensed data would also have a logic value "0". If, however, a contact resistance decreases due to a large width of a bottom contact that contacts a phase-change material of a phase-change memory cell, the phase-change material cannot transit to the reset state. Then the sensed data would have, for example, a logic value "1".

If the data stored in the phase-change memory cell is not identical to the data provided to the phase-change memory cell, a complementary write current of a predetermined amount is provided to the phase-change memory cell in step 430 and the process goes back to step 420. If the sensed data has a logic value "1," the phase-change material has not transited to the set state. Thus, the complementary write current is provided to the phase-change memory cell. Then, the data stored in the phase-change memory cell is sensed again and it is determined whether the sensed data is identical to the data provided to the phase-change memory cell.

If the sensed data is not identical to the data provided to the phase-change memory cell, the complementary write current is provided to the phase-change memory cell. The amount of complementary write current is greater than that of the complementary write current that was previously provided to the phase-change memory cell. In other words, the amount of the complementary write current is increased by a predetermined amount every time the complementary write current is provided to the phase-change memory cell.

In step 440, if the data stored in the phase-change memory cell is identical to the data provided to the phase-change memory cell, data is provided to the next phase-change memory cell.

Figure 5:
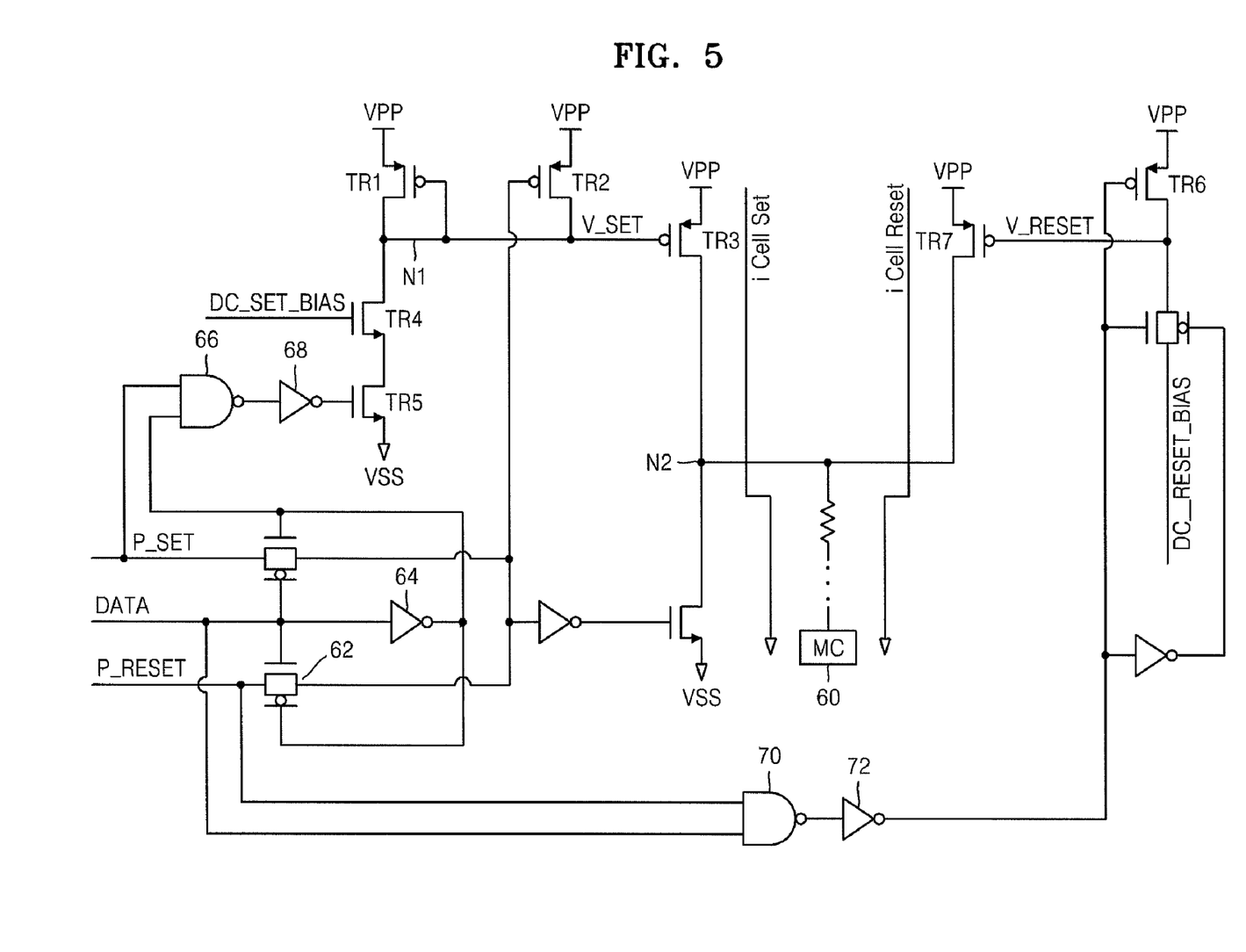
FIG. 5 is a circuit diagram of a write driver according to an exemplary embodiment of the present invention.

FIG. 5 is a circuit diagram of a write according to an exemplary embodiment of the present invention. The operation and configuration of the write driver will be now explained with reference to FIG. 5.

In general, the write driver operates such that while a set pulse P_SET is high, $DC_{13}$ SET_BIAS is sequentially increased or sequentially decreased. Accordingly, a write current for the "set state" increases or decreases. While a reset pulse P_RESET is high, however, a DC_RESET_BIAS BIAS is sequentially increased or sequentially decreased. Accordingly, a write current for the "reset state" decreases or increases.

The write driver stores the data DATA in a phase-change memory cell (MC) 60 in response to the data DATA and a set pulse P_SET, and provides a complementary write current CWC of the increased amount to the phase-change memory cell 60.

A voltage level at a first node N1 at the first level in response to a bias voltage DC SET BIAS and alters the voltage level at the first node N1 to the second level in response to the data DATA and the reset pulse P RESET, thereby providing the data DATA to the phase-change memory cell 60.

The first terminal of a first transistor TR1 is connected to a supply voltage VPP and the gate and the second terminal of the first transistor TR1 are connected to the first node N1. The first terminal of A second transistor TR2 is connected to the supply voltage VPP. The reset pulse P_RESET is input to the gate of the second transistor TR2 after passing through a gate 62. The second terminal of the second transistor TR2 is connected to the first node N1. The first terminal of a third transistor TR3 is connected to the supply voltage VPP. A gate of the third transistor TR3 is connected to the first node N1. The second terminal of the third transistor TR3 is connected to a second node N2.

A fourth transistor TR4 and a fifth transistor TR5 are serially connected between the first node N1 and a voltage VSS. The bias voltage DC SET BIAS is input to the gate of the fourth transistor TR4. The data DATA is input to the gate of the fifth transistor TR5 after passing through a first inverter 64, an AND gate 66, and a second inverter 68. The second input of the AND gate 66 is a set pulse P SET.

The reset pulse P_RESET is fed to an input of an AND gate 70 whose other input is the data signal DATA. An inverter 72 inverts the output of the AND gate 72 and outputs the inverted signal of the reset pulse P_RESET to the gate of a sixth transistor TR6.

The inverted output of the AND gate 70 also turns on gate 74 that causes the DC_RESET_BIAS to be fed as the reset voltage to the gate of a seventh transistor TR7 whose output is connected to node N2 and, thus, to the memory cell 60.

The bias voltage DC_BIAS turns on the fourth transistor TR4. Because the reset pulse P_RESET is at a low level until the data DATA is received, the second transistor TR2 maintains the voltage level at the first node N1 at the first level, i.e., a high level. Once the data DATA is received, the fifth transistor TR5 is turned on and the second transistor TR2 is turned off in response to the reset pulse P_RESET. Then the voltage level of the first node N1 is altered to a low level and the third transistor TR3 is turned on.

Because the third transistor TR3 is turned on, the data DATA is output at a high level through the third node N3. The output data DATA is stored in the phase-change memory cell 60.

Figure 6:
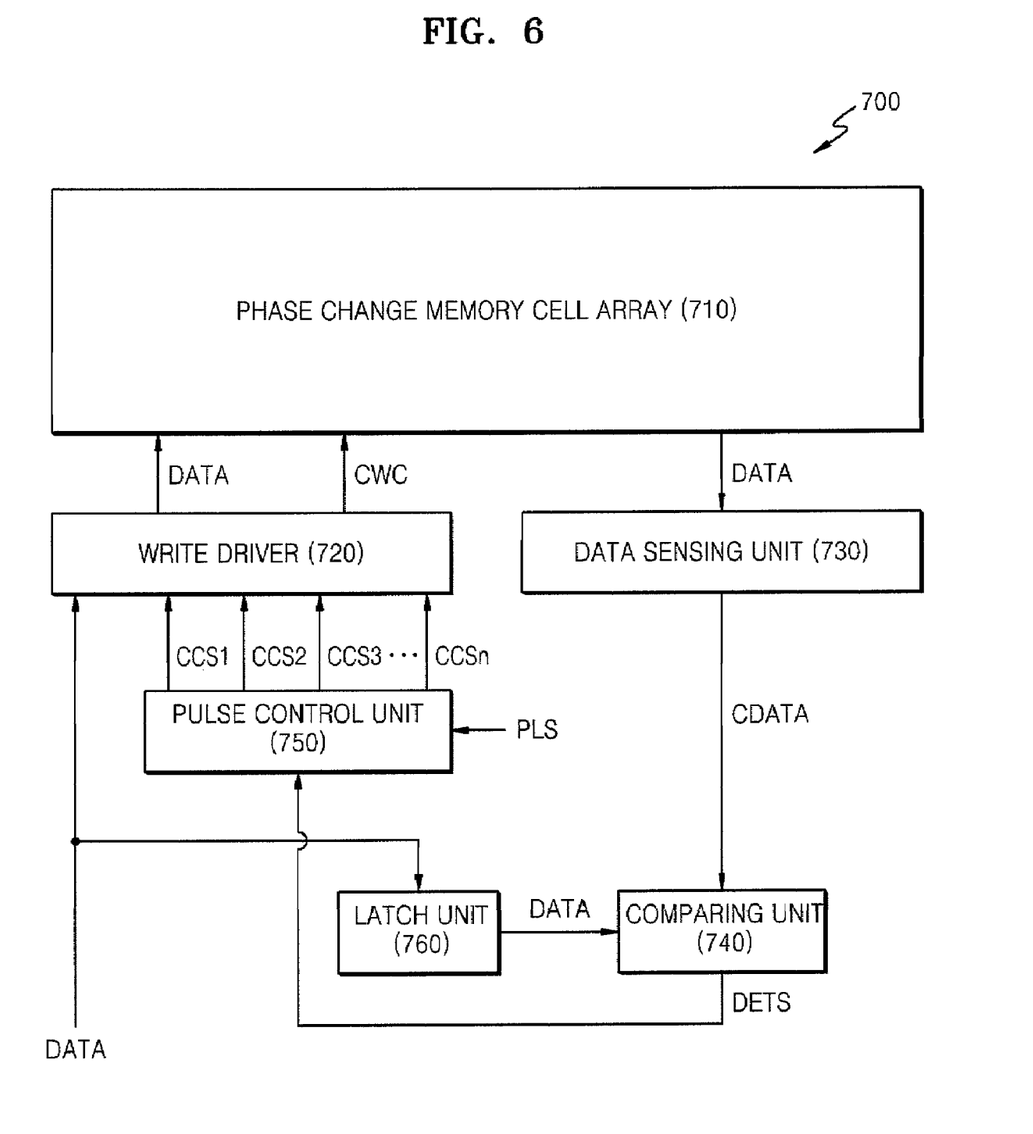
FIG. 6 is a block diagram of a phase change memory device according to an exemplary embodiment of the present invention.

FIG. 6 is a block diagram of a phase-change memory device 700 according to an exemplary embodiment of the present invention. The phase-change memory device 700 includes a phase-change memory cell array 710, a write driver 720, a data sensing unit 730, a comparing unit 740, and a pulse control unit 750.

The write driver 720 receives data DATA and provides the data DATA to a phase-change memory cell of the phase-change memory cell array 710. The write driver 720 provides a complementary write current CWC to the phase-change memory cell in response to one of first through $n^{th}$ current control signals CCS1 through CCSn. The data DATA provided to the phase-change memory cell is reset data. The write driver 720 will be described later.

The data sensing unit 730 senses the data DATA stored in the phase-change memory cell and outputs a logic value of the sensed data and stores the data as a cell data signal CDATA. The data sensing unit 730 may be a sense amplifying circuit.

If a current corresponding to the reset data is provided to the phase-change memory cell and a phase-change material of the phase-change memory cell transits to a reset state, the cell data signal CDATA output from the data sensing unit 730 has the same logic value as that of the reset data, e.g., a logic value "1". If, however, the width of a bottom contact that contacts the phase-change material of the phase-change memory cell is larger than the width of a bottom contact that contacts the phase-change material in other phase-change memory cells, the phase-change material of the phase-change memory cell to which the reset data is provided cannot transit to the reset state. If so, the cell data signal CoDATA output from the data sensing unit 730 has a logic value "0", which is different from that of the reset data.

The comparing unit 740 determines whether the data DATA provided to the phase-change memory cell and the data DATA stored in the phase-change memory cell are identical by comparing the data DATA provided to the phase-change memory and the cell data signal CDATA and outputs the comparison result as a detection signal DETS.

The phase-change memory device 700 may further include a latch unit 760 that latches the data DATA provided to the phase-change memory cell. The comparing unit 740 determines whether the data DATA stored in the latch unit 760 and the data DATA stored in the phase-change memory cell are identical.

Because the data DATA stored in the latch unit 760 is reset data, it has a logic value "1". If the cell data signal CDATA has a logic value "1", the data DATA stored in the latch unit 760 and the data DATA stored in the phase-change memory cell are identical. Then the comparing unit 740 outputs the detection signal DETS at a second level.

If the cell data signal CDATA has a logic value "0", the data DATA provided to the phase-change memory cell and the data DATA stored in the phase-change memory cell are not identical. Then the comparing unit 740 outputs the detection signal DETS at a first level. Here, it is assumed that the first level is at a high level and the second level is at a low level. It is to be understood, however, that the present invention is not limited to this assumption.

The pulse control unit 750 generates the first through $n^{th}$ current control signals CCS1 through CCSn in response to the detection signal DETS and a pulse signal PLS. If the detection signal DETS is at the first level, the pulse control unit 750 outputs the first through $n^{th}$ current control signals CCS1 through CCSn sequentially in response to the pulse signal PLS. If the detection signal DETS is at the second level, the pulse control unit 750 does not output the first through $n^{th}$ current control signals CCS1 through CCSn. In other words, the pulse control unit 750 only operates when the data DATA stored in the latch unit 760 and the data DATA stored in the phase-change memory cell are not identical.

As described above, a phase-change memory device and method which maintains a resistance of a phase-change material in a set state within a constant resistance range enables the resistances of phase-change materials in phase-change memory cells in a set state to be maintained within a constant resistance range even when the widths of the bottom contacts that contact phase-change materials vary among different phase-change memory cells.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A write driver of a phase-change memory device, the write driver comprising:
    a first current control unit, which provides data to a phase-change memory cell in response to the data and a set pulse; and
    a second current control unit, which provides a complementary write current to the phase-change memory cell in response to first through $n^{th}$ current control signals if data stored in the phase-change memory cell and the data provided to the phase-change memory cell are not identical.

2. The write driver of claim 1, wherein the first current control unit maintains a voltage level at a first node at a first level in response to a bias voltage, alters the voltage level at the first node to a second level in response to the data and the set pulse, and provides the data to the phase-change memory cell.

3. The write driver of claim 2, wherein the first current control unit comprises:
    a first transistor comprising a first terminal connected to a supply voltage, a gate and a second terminal connected to the first node;
    a second transistor comprising a first terminal connected to the supply voltage, and a second terminal connected to the first node, wherein the set pulse is applied to the gate of the second transistor;
    a third transistor comprising a first terminal connected to the supply voltage, a gate connected to the first node, and a second terminal connected to a second node;
    a fourth transistor, wherein the bias voltage is input to the gate of the fourth transistor; and
    a fifth transistor having a first terminal connected to an output of the fourth transistor.

* * * * *